(12) United States Patent
Lande et al.

(10) Patent No.: US 10,969,430 B2
(45) Date of Patent: Apr. 6, 2021

(54) HIGH PRECISION TIME MEASUREMENT APPARATUS

(71) Applicant: Novelda AS, Oslo (NO)

(72) Inventors: Tor Sverre Lande, Oslo (NO); Håkon André Hjortland, Oslo (NO)

(73) Assignee: Novelda ASA, Kviteseid (NO)

( * ) Notice: Subject to any disclaimer, the term of this patent is extended or adjusted under 35 U.S.C. 154(b) by 595 days.

(21) Appl. No.: 15/752,825

(22) PCT Filed: Aug. 12, 2016

(86) PCT No.: PCT/GB2016/052520
§ 371 (c)(1),
(2) Date: Feb. 14, 2018

(87) PCT Pub. No.: WO2017/029484
PCT Pub. Date: Feb. 23, 2017

(65) Prior Publication Data
US 2018/0246168 A1 Aug. 30, 2018

(30) Foreign Application Priority Data
Aug. 14, 2015 (GB) .................................... 1514522

(51) Int. Cl.
*G01R 31/317* (2006.01)
*G01R 31/3193* (2006.01)
(Continued)

(52) U.S. Cl.
CPC . *G01R 31/31725* (2013.01); *G01R 31/31937* (2013.01); *H03K 5/14* (2013.01);
(Continued)

(58) Field of Classification Search
CPC ........ G01R 31/31725; G01R 31/31937; H03K 2005/00078; H03K 21/02; H03K 21/08; H03K 5/14
See application file for complete search history.

(56) References Cited

U.S. PATENT DOCUMENTS 5,860,100 A   1/1999  Feiste et al.
5,867,693 A   2/1999  Wang et al.
(Continued)

FOREIGN PATENT DOCUMENTS

CN   1798980 A    7/2006
CN   102246415 A  11/2011
(Continued)

OTHER PUBLICATIONS

English translation of Office Action issued in Taiwanese Application No. 105125682, dated Jan. 9, 2020, 4 pages.
(Continued)

*Primary Examiner* — Giovanni Astacio-Oquendo
*Assistant Examiner* — Adam S Clarke
(74) *Attorney, Agent, or Firm* — Klarquist Sparkman, LLP

(57) ABSTRACT

A delay measurement apparatus for measuring a delay unit comprising: a clock; clock counter; a digital signal source that is uncorrelated with the clock; a first detector arranged to detect transitions of the digital signal entering the delay unit; a first accumulator arranged to accumulate the current clock counter value based on the output of the first detector; a second detector arranged to detect transitions of the digital signal exiting the delay unit; a second accumulator arranged to accumulate the current clock counter value based on the output of the second detector; a measurement counter arranged to count the number of transitions of the digital signal passing through the delay unit; and a calculation
(Continued)

device arranged to calculate an average number of clock cycles that elapse while a transition of the digital signal passes through the delay unit based on the first accumulator, the second accumulator and the measurement counter.

24 Claims, 2 Drawing Sheets

(51) Int. Cl.
| | |
|---|---|
| *H03K 5/14* | (2014.01) |
| *H03K 21/02* | (2006.01) |
| *H03K 21/08* | (2006.01) |
| *H03K 5/00* | (2006.01) |

(52) U.S. Cl.
CPC ............. *H03K 21/02* (2013.01); *H03K 21/08* (2013.01); *H03K 2005/00078* (2013.01)

(56) References Cited

U.S. PATENT DOCUMENTS

| | | | |
|---|---|---|---|
| 5,890,100 | A | 3/1999 | Crayford |
| 6,069,849 | A | 5/2000 | Kingsley et al. |
| 2002/0060328 | A1 | 5/2002 | Sakurai et al. |
| 2006/0268632 | A1* | 11/2006 | Schnell ............ G01R 31/31725 365/194 |
| 2012/0230158 | A1* | 9/2012 | Chuang ............ G01R 31/31726 368/113 |
| 2013/0188766 | A1 | 7/2013 | Williams |
| 2014/0254742 | A1* | 9/2014 | Shimazaki ......... G01R 31/2607 377/20 |
| 2015/0177327 | A1* | 6/2015 | Chien .............. G01R 31/31727 714/731 |

FOREIGN PATENT DOCUMENTS

| | | |
|---|---|---|
| CN | 102937889 A | 2/2013 |
| CN | 105659938 B | 4/2015 |
| TW | 201320608 | 5/2013 |

OTHER PUBLICATIONS

First Notification of Office Action (English translation) for Chinese Patent Publication No. 201680059398.3, dated Dec. 12, 2019, 8 pages.
International Search Report and Written Opinion for PCT/GB2016/052520, dated Nov. 14, 2016, 12 pages.
Search Report under Section 17(5) from the United Kingdom Intellectual Property Office for GB1514522.0, dated Jan. 19, 2016, 3 pages.

\* cited by examiner

HIGH PRECISION TIME MEASUREMENT APPARATUS

CROSS REFERENCE TO RELATED APPLICATIONS

This is the U.S. National Stage of International Application No. PCT/GB2016/052520, filed Aug. 12, 2016, which was published in English under PCT Article 21(2), which in turn claims the benefit of Great Britain Application No. 1514522.0, filed Aug. 14, 2015.

The invention relates to methods and apparatus for high precision time measurement. In particular, the invention relates to time measurement circuits for chip integration.

Delay elements are often used on circuits (both digital and analog) to delay signal propagation through the circuit. Depending on the purpose of the circuit, in many cases the accuracy of the delay elements is adequate. However for high precision timing, the production spread (i.e. the manufacturing tolerance) of delay elements can lead to unpredictable operation or operation that requires correction or compensation. These problems become particularly relevant at very high speeds where the delay elements are reduced to the minimum possible delay. For example, a number of inverters in series can be used as a simple delay unit and each inverter introduces a delay of approximately 10 picoseconds. Such delay units may be used in delay lines where each tap off the delay line represents a delayed version of the original signal. Such delay lines and delay units are required for processing signals in the Gigahertz/Terahertz range.

When the production spread causes significant timing inaccuracies, it becomes necessary to measure the delay time of a delay unit accurately. Once the delay time is known accurately, other correction or compensation techniques can be applied to mitigate against the time variations.

Traditional delay measurement techniques for larger delay elements measure the number of clock cycles that elapse while a test signal is passed through the delay element. At very high frequencies and with very short delays, timing measurement becomes difficult as the delay approaches (or drops below) the length of a clock cycle. Timing accuracy is then very limited.

According to a first aspect of the invention, there is provided a delay measurement apparatus for measuring a delay unit comprising: a clock; clock counter that counts clock cycles; a digital signal source that is uncorrelated with the clock; a first detector arranged to detect transitions of the digital signal entering the delay unit; a first accumulator arranged to accumulate the current clock counter value based on the output of the first detector; a second detector arranged to detect transitions of the digital signal exiting the delay unit; a second accumulator arranged to accumulate the current clock counter value based on the output of the second detector; a measurement counter arranged to count the number of transitions of the digital signal passing through the delay unit; and a calculation device arranged to calculate an average number of clock cycles that elapse while a transition of the digital signal passes through the delay unit based on the first accumulator, the second accumulator and the measurement counter.

As each transition passes through the delay unit it triggers the current clock value to be added to the first accumulator just before it enters the delay unit and it triggers the current clock value to be added to the second accumulator just after it exits the delay unit. Thus the difference between the first and second accumulators represents the time taken to pass through the delay unit. After a number of transitions have passed through, the first and second accumulators will have accumulated the sum of several time stamps and the difference between them represents an accumulation of delay measurements, each measurement being to the nearest clock cycle. At the same time, the measurement counter keeps track of the number of transitions that have passed through and therefore dividing the accumulated difference by the number of transitions provides an average transition time. The measurement of a single transition pass through the delay unit will only be accurate to the nearest clock cycle. However, providing the digital signal source (i.e. the timings of the transitions) is sufficiently uncorrelated with the clock, repeated measurements will result in measurements that differ by one clock cycle, i.e. a certain proportion of measurements will be N clock cycles, while the remainder will be N+1 clock cycles. Over a large number of repeated and uncorrelated measurements, the proportions of each of these measurements will be accurately reflected in the averaged output, thus providing a much more accurate measurement of the delay unit's delay.

The digital signal source is digital in value (i.e. in amplitude) so that it provides sharp transitions that precisely and reliably define the time of entry and time of exit from the delay unit. The digital signal source is preferably continuous in time so that the transitions may occur at any time, not just at discrete time points that may be correlated with the clock.

The delay unit may be a single delay circuit or it may be a series of smaller delay circuits such as a string of inverters (or other short delays) connected in series. The delay unit may be a controllable or adjustable delay unit. Measuring the delay of such units can be used in a feedback mechanism to achieve a high accuracy of adjustment.

The first accumulator may be arranged to add a received clock counter value to its current stored value, and the second accumulator may be arranged to add a received clock counter value to its current stored value. The calculation device may comprise a subtractor arranged to subtract the first accumulator value from the second accumulator value.

The measurement counter may be arranged to count the number of transitions detected by the first or second detector, The purpose of this counter is to keep track of the number of measurements taken and may be sensed either before or after the delay under measurement.

If the delay unit has a long delay compared with the spacing between transitions, there may be several transitions passing through the delay unit at a given time. To ensure accurate measurements, it is necessary to make sure that both entry and exit times are taken for each transition, i.e. an exit time must be taken into account for every transition for which an entry time has been taken into account. This may be done by ensuring that no transitions are in the delay unit before the measurement commences and that all transitions have exited the delay unit before the measurement is finished. This may be achieved by stopping or disconnecting the digital signal source and waiting for a time longer than the delay of the delay unit. Alternatively, the number of transitions entering and exiting can both be counted and a check can be made to ensure that the counts are the same.

It is particularly advantageous if measurements can be made during normal use without interrupting operation and use of the delay unit. Without interrupting operation it is difficult to guarantee that no transitions are passing through the delay unit at the commencement of measurement.

The delay measurement apparatus thus preferably further comprises: an input transition counter arranged to count the transitions entering the delay unit; and an output transition counter arranged to count the transitions exiting the delay unit.

By counting the transitions detected by both the first and second detectors, the apparatus can keep track of how many transitions are in the delay unit. So long as a reset operation is performed upon start up (when no transitions are in the delay unit), the two transition counters can thereafter keep track of the number of transitions entering and the number of transitions exiting the delay unit.

The measurement counter preferably comprises a first measurement counter arranged to count a number of measurements taken from transitions entering the delay unit and a second measurement counter arranged to count a number of measurements taken from transitions exiting the delay unit. These measurement counters are separate from the transition counters and keep track of the number of measurements that have been taken during a particular measurement, while the transition counters count all transitions since the last reset operation.

The delay measurement apparatus preferably further comprises: a controller arranged to compare the input transition counter with the output transition counter and to use that comparison to control the operation of the second measurement counter and the second accumulator. The controller may be arranged to trigger storage in a storage device of the current value of the input transition counter, to compare the current value of the output transition counter with the stored value in the storage device and to enable the second measurement counter when said values are equal. By thus comparing the values of the transition counters, the controller can ensure that the measurements are taken of the same transitions. Measurements of transitions entering the delay unit can be started as soon as a measurement is initiated. However, measurements of the transitions exiting the delay unit must be matched to those transitions that have been measured on entry. As the transition counters will have kept track of all transitions, measurements on exit should only be taken once the output transition counter has reached the value that the input transition counter had at the start of the measurement. The second measurement counter and accumulator are therefore controlled so that they only count and measure the same transitions as have been counted and measured before the delay unit.

In some preferred embodiments, the or each measurement counter is arranged to count down from a preset value. The preset may be set by the controller (and may be adjustable by the user via software), or it may be built into the circuit. Preferably the or each measurement counter is arranged to issue a zero detect signal when its count reaches zero. Having the counter count down to zero is a particularly efficient setup because it avoids making comparisons with the target value. Comparisons with a target value are computationally intensive. By contrast, a zero-detect can be made very simple and fast simply by applying a logical OR to all bits of the counter. The OR will output zero only when the counter reaches zero. Speed is very important for measuring transitions that are close together in time.

The digital signal source may be any suitable source of transitions that is uncorrelated with the clock. However, a clock signal may be used providing the correlation is sufficiently removed. Therefore the digital signal source may be a clock with added noise. Adding a sufficient amount of noise (in the time domain) to the clock signal destroys the correlation such that the measurement will not be influenced.

In some particularly preferred embodiments, the digital signal source may be obtained from the send or receive signal of a low power radar, e.g. an Ultra Wide Band (UWB) radar. The low power radar typically issues a large number of low power pulses that when received and combined provide a detectable signal (i.e. combined for processing gain). Although these pulses are generated using a system clock, noise is often added to the signal and this noise removes the correlation sufficiently for the purposes of using the signal to measure a delay unit. Additionally, noise will be introduced in the reflected signal by the backscattering object's surface and other noise sources. The backscattered signal is normally highly affected by the surface texture of the object and also mixes with reflections from other surrounding surfaces (e.g. nearby walls and so on).

According to another aspect, the invention provides a low power radar comprising one or more delay units and one or more delay measurement apparatuses as described above, optionally including any of the preferred features also described above.

According to a further aspect, the invention provides a method of measuring the delay of a delay unit comprising: counting clock cycles of a clock in a clock counter; passing a digital signal through the delay unit, said digital signal being uncorrelated with the clock; detecting transitions that enter the delay unit; based on said entry transition detection, adding a current clock counter value to a first accumulator; detecting transitions that exit the delay unit; based on said exit transition detection, adding a current clock counter value to a second accumulator; counting the number of detected transitions that have passed through the delay unit; calculating an average number of clock cycles that elapse while a transition of the digital signal passes through the delay unit based on the value in said first accumulator, the value in said second accumulator and the counted number of transitions that have passed through the delay unit.

The preferred features described above in relation to the apparatus apply equally to the method.

The measurement method may be initiated while the delay unit is in use, i.e. while transitions are passing through the delay unit, i.e. between entry and exit.

The first accumulator may add the clock counter value to its current stored value. The second accumulator may add the clock counter value to its current stored value. The calculation device may comprise a subtractor that subtracts the first accumulator value from the second accumulator value. The measurement counter may count the number of transitions detected by the first detector. The method preferably further comprises: counting the transitions entering the delay unit; and counting the transitions exiting the delay unit.

The measurement counter may comprise a first measurement counter that counts a number of measurements taken from transitions entering the delay unit and a second measurement counter that counts a number of measurements taken from transitions exiting the delay unit. The method may further comprise: comparing the input transition count with the output transition count and using that comparison to control the operation of the second measurement counter and the second accumulator. The method may comprise: storing the current value of the input transition count, comparing the current value of the output transition count with the stored value; and enabling the second measurement counter when said values are equal.

The or each measurement counter may counts down from a preset value. The or each measurement counter may issues a zero detect signal when its count reaches zero.

The digital signal source may be a clock with added noise. The digital signal source may be obtained from the send or receive signal of a low power radar.

Preferred embodiments of the invention will now be described, by way of example only, and with reference to the accompanying drawings in which:

FIG. 1 shows a schematic circuit diagram showing time measurement of a delay unit 100 according to a first embodiment of the invention.

Figure 1:
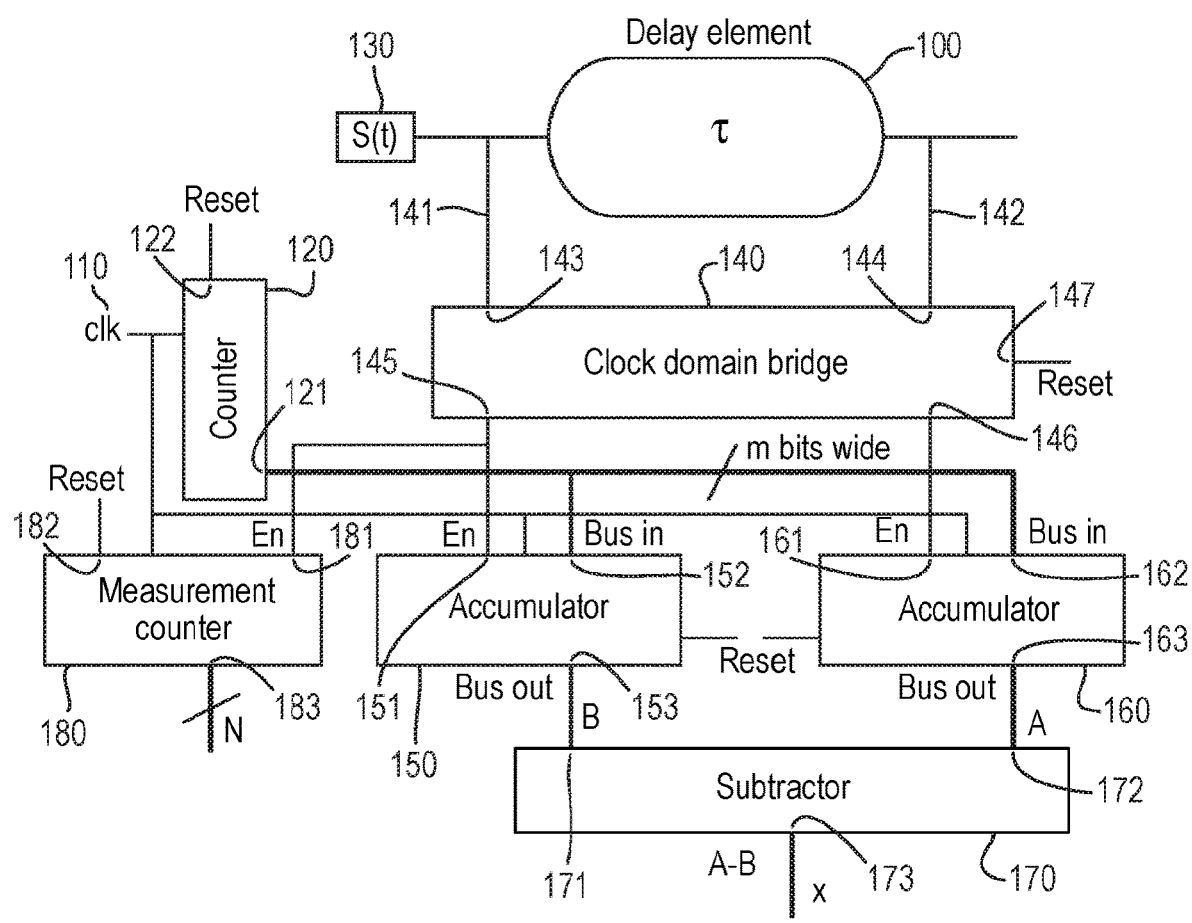
FIG. 1 shows a first embodiment of a time measurement apparatus.

A clock 110 provides the main timing mechanism for the apparatus. It will be appreciated that in some embodiments a number of different clocks could be used, but for power efficiency it is preferred to use a single clock for all functions. The clock 110 is preferably a fast clock (as fast as is practical for the application) as it is a limiting factor for operation of some of the logic elements like the accumulators and subtractors discussed below.

The clock 110 feeds directly into a clock counter 120 that simply counts up continuously once per clock cycle. The counter may take any form, e.g. a binary counter or a ring counter or a combination of the two, depending on the required speed of operation.

A signal source 130 produces a signal that will be used to measure the time taken for signal propagation through delay element 100. Signal source 130 may be a dedicated source to produce a test signal or it may be a part of the apparatus, e.g. the output from an external signal receiver such as an antenna (and optionally associated amplifiers). Either way, the signal source 130 must be uncorrelated with the clock 110. If the signal source 130 is in some way associated with the clock 110, e.g. if it is driven by the clock 110 then it can still be used providing there is sufficient noise that the signal from signal source 130 is essentially uncorrelated with the clock 110. Noise can be purposefully introduced onto the signal for this purpose if required.

Signal S(t) is a digital signal with well defined transitions that can reliably be detected both before and after passage through delay unit 100.

The signal S(t) is fed into delay unit 100. The signal S(t) is tapped just before the delay unit 100 at 141 and fed into Clock domain bridge 140. Clock domain bridge 140 detects a transition on signal S(t). This may be either a rising transition or a falling transition. Although both rising and falling transitions could be used in theory, in practice the processing of these will typically be asymmetric which would impair reliability, so a single transition type is preferred. When clock domain bridge 140 detects a transition on S(t) before the delay unit 100 at tap 141 it latches and activates the enable input 151 on first accumulator 150. Similarly, when clock domain bridge 140 detects a transition on S(t) after the delay unit 100 at tap 142 it latches and activates the enable input 161 on second accumulator 160. The clock domain bridge 140 latches its outputs for a clock cycle, i.e. long enough for the accumulators 150, 160 to perform their functions.

The output 121 of counter 120 is connected to the inputs 152, 162 of first and second accumulators 150, 160. When enabled, upon receipt of a clock signal, accumulators 150, 160 add the value on their bus inputs 152, 162 to their currently stored value. The currently stored values are available on first accumulator bus output 153 and second accumulator bus output 163. These bus outputs 153, 163 are connected to first subtractor input 171 and second subtractor input 172. Upon receipt of a clock signal, subtractor 170 subtracts the value B on input 171 from the value A on input 172. The output x=A−B is made available on subtractor output 173.

As the first accumulator 150 keeps track of the sum of the counter values received from before the delay element 100 and the second accumulator 160 keeps track of the sum of the counter values received from after the delay element 100, together they keep track of the accumulated difference between entrance and exit counter values for the delay unit 100. For any single measurement (i.e. a single transition propagating through delay unit 100) the difference is only measured in whole elapsed clock cycles. However, when the accumulated difference obtained over many measurements is averaged, the accuracy is improved to a fraction of a clock cycle. Thus, by performing a plurality of measurements and averaging the results, the delay of delay unit 100 can be measured to a much greater accuracy than the clock 110 alone would permit.

In order to perform an average, it is also necessary to keep track of the number of measurements that are being averaged. This is equal to the number of transitions that have passed through the delay unit 100. Assuming no loss of transitions within delay unit 100 this can be equated with both the number of transitions entering delay unit (i.e. number of transitions detected on tap 141) and the number of transitions exiting delay unit 100 (i.e. the number of transitions detected on tap 142). Measurement counter 180 in FIG. 1 is a simple counter that increases its count by one when its enable input 181 is high. Enable input 181 is conveniently connected to the output 145 of clock domain bridge 140 which is latched after detecting a transition of S(t) on tap 141 before entering delay unit 100.

Each of counter 120, clock domain bridge 140, first accumulator 150, second accumulator 160 and measurement counter 180 have a reset input (respectively 122, 147, 154, 164, 182) that resets the values to zero and clears any latched inputs and outputs. A full reset is required before any measurement is taken and between any successive measurements. The signal source 130 should also be blocked from transmitting any signals through delay unit 100 during a reset operation so that it can be ensured that no transitions are still propagating through delay unit 100 while a reset is underway.

Thus the high precision measurement of continuous-time delay units can be achieved using time measurement circuits that are integrated onto the chip.

The measurement procedure essentially generates timestamps for the digital periodic or non-periodic signal (S(t)) before and after the delay unit 100, corresponding to the digital signal edge (transition) as it propagates through the delay unit 100. The propagation time is calculated by subtracting the timestamps from each other.

In conventional solutions the measuring precision is limited by the period of clk. However, by constructive use of jitter noise and/or uncorrelated signals, repeated measurements will give much higher precision.

The repeated signals (i.e. repeated transitions) that are required to obtain enough measurements for the process to provide a reliable measurement can be obtained in many cases through repetition that is a part of the overall circuit design. For example many applications use repeated signals for processing gain. One particular example of this may be a low power radar (e.g. an Ultra Wide Band radar) that sends the same signal a large number of times at low power (e.g. low enough to meet regulations) so that the receiver can accumulate the many received signals (which may individually be below the noise level) and thereby generate an accumulated receive signal that stands out from the noise. Each of the repeated measurements can be passed through the delay unit 100 and provide a single measurement of its delay.

The measurement procedure is a time-domain solution which makes use of standard digital blocks, thus allowing for simple integration in standard digital technology like CMOS. The apparatus functions as a time-to-digital converter (TDC). However, unlike previous solutions, noise is used constructively in combination with processing gain for high precision measurements. A notable feature is that any duration of delay unit 100 may be measured with this apparatus; long delays, short delays all the way down to zero delay (e.g. essentially the absence of a delay unit 100). A further advantage is that signals in either direction can be measured provided a bidirectional delay line is used.

In order to ensure proper operation of the embodiment described here, the following conditions should be met:
1. The time difference between signal triggering transitions of the S(t) signal (i.e. the pulse repetition frequency) must be larger than the clk period. This is because the accumulators are clocked devices. Therefore if two transitions arrive at the delay unit 100 within the space of a single clock cycle, the first accumulator 150 will only add a timestamp for one of them.
2. S(t) and clk should be uncorrelated and/or sufficient jitter noise must be present in the S(t) signal that it is essentially uncorrelated with clk. S(t) must be a repeated signal (i.e. there must be a statistically significant number of incoming transitions in the S(t) signal to trigger a statistically significant number of measurements of delay unit 100). However, S(t) does not have to be periodic, i.e. it need not produce transitions regularly or even semi-regularly. The time period between successive transitions may vary greatly.
3. The accumulators and the subtractor should have a number of bits matching the resolution desired for the desired measurement quality of x. For example, although wrap-around of the values in the first and second accumulators 150, 160 does not affect the result, the number of bits in each accumulator must be sufficient that the difference between the values of the first accumulator 150 and the second accumulator 160 is unique to the measurement. If the number of bits were too small, there would be an aliasing effect with ambiguity in the subtracted value x.
4. There should be no loss of transitions in the delay element. Loss of transitions will result in the first accumulator 150 adding a timestamp for the entry time, but the second accumulator 160 not adding a corresponding timestamp for the exit time, thus causing errors in the measurement result.

The fundamental principle of the time measurement apparatus will improve with wider (i.e. greater number of bits) accumulators and counters. As mentioned above, wrap-around is tolerable and will not affect measurement precision as long as the number of bits is higher than the aimed resolution. The number of bits in the accumulators/counters must be sufficient for measuring the distance between consecutive edges passing through the delay element under measurement. This is determined by the clock speed and the maximum temporal distance expected for the actual application. All accumulators and counters do tolerate wrap-around without losing measurement quality, except that the measurement counter (N) cannot tolerate wrap-around.

Assume that the clock, clk is running at a frequency denoted by $f_c$. A suitable measurement procedure for this embodiment can be described as follows:
1. Disable the S(t) signal.
2. Reset counters 120, 180, accumulators 150, 160 and clock domain bridge 140.

Steps 1 and 2 provide an initial synchronization and may not necessarily be required for subsequent measurements.
3. Apply the S(t) signal repeatedly for a measurement time giving the desired measurement accuracy. Alternatively the measurement procedure may be done for a predetermined number of measurements (N). In the former case, the measurement may be taken when the clock counter 120 has reached a designated value. In the latter case, the measurement may be taken when the measurement counter 180 has reached a designated value.
4. Read out binary words x(from subtractor output 173) and N (from measurement counter output 183) as results. The measured delay time $\hat{\tau}$ is then computed as:

$$\hat{\tau} = \frac{x}{N} \cdot \frac{1}{f_c} \quad (1)$$

At high digital signal frequencies, dynamic noise (jitter) appears. However, this jitter noise may be used for improved measurement precision. In many implementations the S(t) signal will be repeated (although not necessarily periodic) for processing gain improvements. Assuming a Gaussian noise distribution, processing gain may therefore improve timing precision with a factor proportional to $\sqrt{N}$ where N is the number of repetitions.

Although a true lack of correlation between the clock and the measurement signal S(t) is preferred, in other embodiments of the invention an improved measurement accuracy can still be achieved where the signals are correlated, but sufficiently spread in relation to one another. The lack of correlation or the extent of desynchronisation between the signals results in spreading of the measurement. In other words, the relative timing between the transition in S(t) and the clock edge is distributed (spread) across a clock cycle. For example, if the frequency of the measurement signal is f(S(t)) and the clock frequency is $f_c$, the ratio $f(S(t)):f_c$ should be such that a large number of transitions occur on S(t) between instances at which the relative phase of the two signals repeats. This ensures that measurements of the delay unit 100 will be spread in time in relation to the clock signal and thus each individual measurement will potentially measure different numbers of clock cycles, providing overall better accuracy across many measurements.

For best measurement quality, the phase between the clk signal and the S(t) signal should be skewed. By choosing a frequency ratio between the clk and the S(t) signal ensuring a large (e.g. preferably >100) number of both the numerator and the denominator of the reduced fraction ($f_c/f(S(t))$) of the ratio, improved measurement performance is achieved. For smaller numerator/denominator values (<100) it may still be possible to get good results with $f_c$ only marginally larger than the signal frequency, provided that this together with other noise provides sufficient spreading of S(t) and clk.

A typical example of a working ratio might be $f_c=2.11*f(S(t))$. This can be expressed as a fraction as 211/100, i.e. with both numerator and denominator≥100. Generating S(t) and clk from the same references will generally not work unless major jitter is present in the S(t) signal as otherwise there will not be sufficient spread and/or decorrelation between the two signals. Preferably the two signals (clk and S(t)) are generated from separate sources, e.g. from separate crystal oscillators. Jitter noise on the S(t) signal is therefore still preferred for improved accuracy where possible.

Some delay elements may permit signal propagation in either direction. It should be noted that a signal can be propagated through the delay unit 100 of FIG. 1 in either direction. The delay-element may therefore be bidirectional or it may even have an unknown propagation direction. Changing the direction of the signal through the delay element 100 merely alters the sign of the subtraction result.

Shadow Time Measurement

A second embodiment of the invention will now be described, with reference to FIG. 2.

The first embodiment of the time measurement procedure described in relation to FIG. 1 requires control of the signal path (i.e. start/stop of S(t)). In some critical applications signal disruption may be undesirable or even unacceptable. However, with some additional circuitry a completely transparent measurement procedure for uninterrupted time measurements is feasible. In this document this is referred to as shadow time measurement. To do this it is necessary to keep track of the number of signal transitions before and after the delay under measurement. The actual time measurement is carried out by counting a preset number of transitions.

Figure 2:
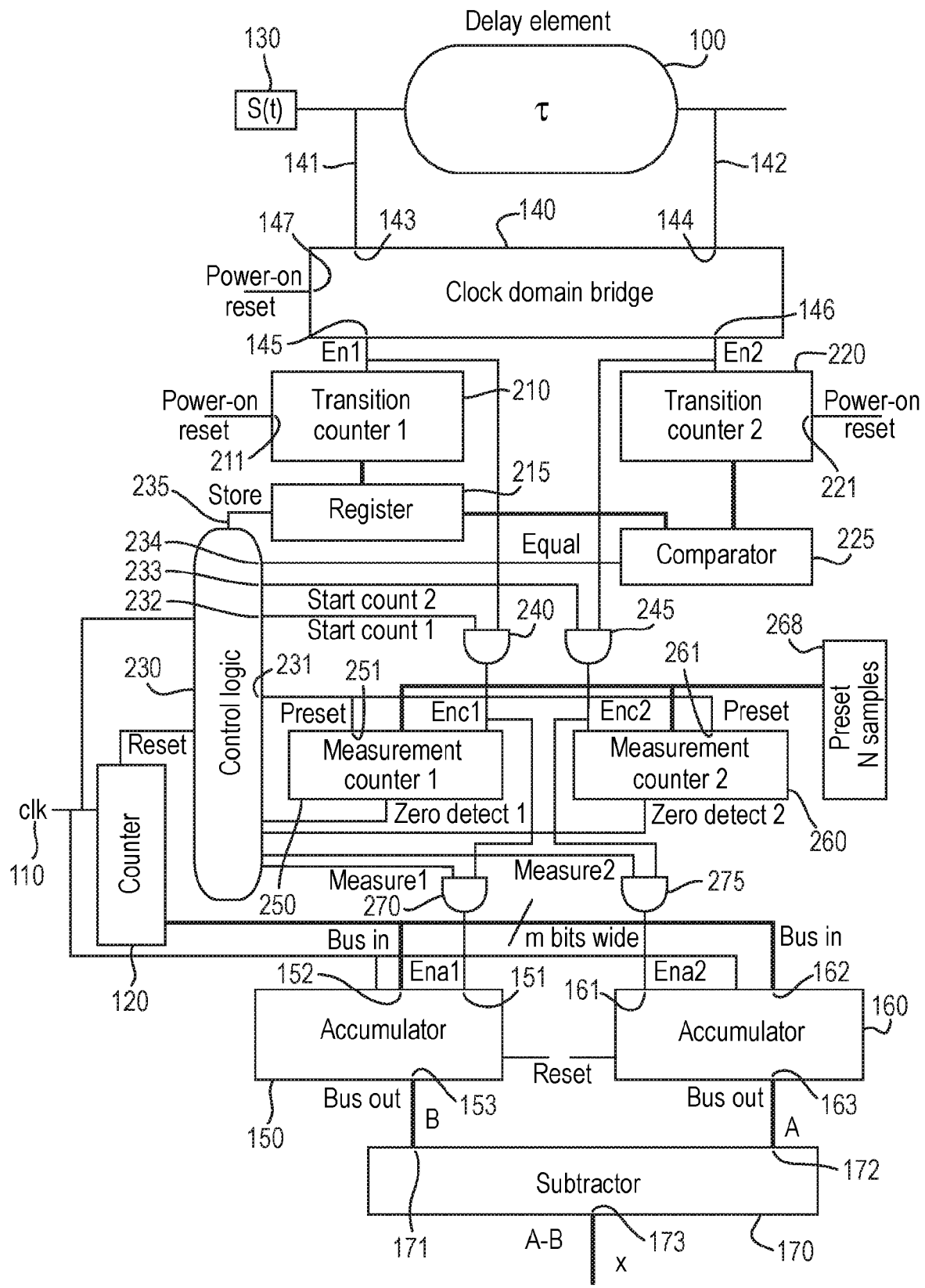
FIG. 2 shows a second embodiment of a time measurement apparatus.

The complete shadow time measurement architecture is shown in FIG. 2. First transition counter 210 and second transition counter 220 are disposed immediately after the clock domain bridge 140 for counting the number of transitions passing through the delay unit 100 under test. First transition counter 210 counts the number of transitions that have entered delay unit 100 and second transition counter 220 counts the number of transitions that have exited delay unit 100.

The transition counters 210, 220 are initiated at power-up via reset inputs 211, 221. This is done at power-up so as to guarantee no transitions in the delay unit 100. Any subsequent resets must ensure that there are no transitions within the delay unit 100 while both transition counters 210, 220 are reset. At the same time, clock domain bridge 140 is also reset so as to clear the latched/unlatched status of its outputs 145, 146 and properly set the state of any internal memory elements (which may be in arbitrary states after a power-up event). As with the first embodiment, for proper operation no transitions should be lost in the delay unit 100. The main purpose of the transition counters 210, 220 is to find the proper initial offset in time between the pre-delay and post-delay measurement down-counters 250, 260 (described further below). This offset is found by latching the value of the pre-delay counter 210 in register 215 and waiting until the comparator 225 matches this value with that of the post-delay counter 220. Control logic block 230 initiates this latching via "Store" output 235 connected to register 215. The comparator 220 signals a match to control logic 230 on input 234.

The measurement down-counters 250, 260 are initiated with a preset measurement count (N) provided by preset value 268 (this may be a hardware coded value or may be a storage element such as memory cells with a variable value that can be set e.g. via software. The preset should be set according to the desired measurement accuracy. A higher value of N will yield a better accuracy. The control logic block 230 starts the down-counters 250, 260 at the beginning of a measurement by triggering a load action from preset 268 via output 231 connected to preset pins 251, 261. The measurement down-counters 250, 260 are started counting down with the proper offset in time by control logic block 230 via the "Start count 1" output 232 connected to first measurement counter 250 and "Start count 2" output 233 connected to second measurement counter 260.

As long as the down-counters have a value greater than zero, clock counter values (from clock counter 120) are accumulated in the first 150 and second 160 accumulators respectively, and the actual time measured can be found by the same computational procedure as described above in relation to the first embodiment.

A suitable measurement procedure for this second embodiment can be described as follows:
1. Load preset value into the first measurement counter 250 and second measurement counter 260 and reset clock counter 120 and first and second accumulators 150, 160.
2. Latch first transition counter 210, storing its value in register 215 and start first measurement counter 250.
3. When second transition counter 260 reaches the stored value (i.e. the value from first transition counter 210 stored in register 215), start measurement counter 2.
4. While each of the first and second measurement counters 250, 260 are counting down and while they have not yet reached zero, continue measuring transitions by accumulating clock counter values in the respective first and second accumulators 150, 160. Stop each measurement accumulator as its respective measurement counter reaches zero.
5. Read out binary words x and N as results.

The measured delay time $\hat{\tau}$ is then computed as earlier:

$$\hat{\tau} = \frac{x}{N} \cdot \frac{1}{f_c}$$

The number of measurements to be made is preset in preset value 268 and is a trade-off between measurement time and measurement accuracy. Preset value 268 may be set in software by the user or based on the type/accuracy of measurements required. If for some reason the transition counters 210, 220 get out of synchronization, they may be reset provided signal propagation through the delay unit 100 under measurement is temporarily stopped. Otherwise the timing measurement may be carried out without signal interruption.

As the measurement down-counters 250, 260 are initiated with the same value, they necessarily measure the same number of transitions. As the transition counters are initiated on power on and keep track of all transitions that have passed through delay unit 100, the use of register 215 and comparator 225 ensures that the transitions measured by first measurement counter 250 are the same as those measured by second measurement counter 260.

The measurement counters 250, 260 could be up-counters instead of down-counters. Instead of preloading with a preset value and comparing the counter to zero, each counter would be initialised to zero and compared with a preset value. However, it is often computationally slower to make a comparison with a preset value. Down-counters are preferred here because comparison with zero can be done fast and efficiently, e.g. by ORing all bits of the register. Such timing issues become very important at high clock rates for measurement of very short delays.

In both of the above embodiments the delay units 100 are "digital", i.e. providing a signal transition propagating through in either direction. Any kind of delay unit may be measured. Typical delay units are digital gates like inverters or NAND gates. In applications where calibrated time-constants are required, the measurement procedure may be combined with tunable delay units for calibration. A feedback procedure may be used whereby the delay of a tunable delay unit is measured using either of the above procedures, then the delay unit is tuned to adjust the delay towards a desired value. These steps may be repeated until the desired delay is achieved.

A variety of tunable elements may be used, such as:
Multiplexer-based digital gates
Capacitor loaded digital delaylines
Resistor loaded digital gates
Back-gate (body-biased) tuning of digital gates
Current-starved digital gates
LC tuned delaylines for high speed operation
Slow-wave co-planar waveguides Any or all of these types of delay elements may be used provided sharp transitions are generated by the delay element.

The clock domain bridge is an important element of the circuit to ensure proper operation. Its main function is to generate a suitable pulse for each positive or negative (but generally not both) edge/transition travelling through the delay element. Several options for this function are possible including:

The edges/transitions to be sampled may generate a pulse by using an edge-trigged one-shot.
The edges/transitions may trigger an edge-trigged toggle flip-flop.
The edges/transitions may trigger a clocked D flip-flop.

Any design may be used so long as the enable outputs are held until the measurement/accumulator action is complete.

The edge-to-pulse conversion of the CDB must ensure that pulses are generated for each edge of the signal implying that the generated pulse width must not exceed the time between edges under measurement.

The clock domain bridge generally does not monitor both positive and negative transitions because these are normally asymmetric and therefore create difficulties in ensuring consistent treatment in onward processing.

The accumulators are selected to be of sufficient length for the desired accuracy and to work at the designated clock speed. Several options for the accumulators are possible including:

A parallel register holding the last latched value (LLV), a parallel adder summing the current input value with the LLV into a separate output register and wherein following a clock cycle the sum (the value of the output register) is transferred to the LLV register. This arrangement is triggered upon receipt of a pulse from the clock domain bridge 140. With this arrangement the clock domain bridge does not need to provide a persistent (latched) output as the accumulator takes on this function, latching the summed value until a clock pulse moves the new value into the LLV register. Separate structures for incoming and outgoing transitions provide inputs to the subtractor measuring the counted difference between the edges to be read on the output EN from the outgoing edge.

An add/subtract block may be used with the EN signal from the incoming edge connected to the add input and the EN signal from the outgoing edge connected to the subtract input. The value is valid on receipt of the EN signal from the outgoing edge.

The subtractor is a full parallel 2-complement adder with complemented or inverted inputs for the incoming edge. The two inputs (from the two accumulators 150, 160) and the subtractor output 173 ($x$) have the same number of bits. Each of the inputs are allowed to overflow/wrap around and the subtractor 170 can thus also overflow/wrap around. Therefore overflow/wrap-around is acceptable in the subtractor 170 and may be ignored.

All counters may be implemented as basic incrementers with an operating speed of the system clock, clk.

It will be appreciated that the above-described embodiments are merely examples and that modifications may be made without departing from the scope of the invention as defined by the claims.

The invention claimed is:

1. A delay measurement apparatus for measuring a delay unit comprising:
a clock;
a clock counter that counts clock cycles;
a digital signal source arranged to produce a digital signal that is uncorrelated with the clock;
a first detector arranged to detect transitions of the digital signal entering the delay unit;
a first accumulator arranged to accumulate a current value of the clock counter based on an output of the first detector;
a second detector arranged to detect transitions of the digital signal exiting the delay unit;
a second accumulator arranged to accumulate a current value of the clock counter based on an output of the second detector;
a measurement counter arranged to count a number of transitions of the digital signal passing through the delay unit; and
a calculation device arranged to calculate an average number of clock cycles that elapse while a transition of the digital signal passes through the delay unit based on the first accumulator, the second accumulator and the measurement counter.

2. A delay measurement apparatus as claimed in claim 1, wherein the first accumulator is arranged to add a received clock counter value to its current stored value, wherein the second accumulator is arranged to add a received clock counter value to its current stored value and wherein the calculation device comprises a subtractor arranged to subtract the first accumulator value from the second accumulator value.

3. A delay measurement apparatus as claimed in claim 1, wherein the measurement counter is arranged to count the number of transitions detected by the first detector.

4. A delay measurement apparatus as claimed in claim 1 further comprising:
an input transition counter arranged to count the transitions entering the delay unit; and
an output transition counter arranged to count the transitions exiting the delay unit.

5. A delay measurement apparatus as claimed in claim 4, wherein the measurement counter comprises a first measurement counter arranged to count a number of measurements taken from transitions entering the delay unit and a second measurement counter arranged to count a number of measurements taken from transitions exiting the delay unit.

6. A delay measurement apparatus as claimed in claim 5, further comprising:
a controller arranged to compare the input transition counter with the output transition counter and to use that comparison to control the operation of the second measurement counter and the second accumulator.

7. A delay measurement apparatus as claimed in claim 6, wherein the controller is arranged to trigger storage in a storage device of the current value of the input transition counter, to compare the current value of the output transition counter with the value of the input transition counter stored in the storage device and to enable the second measurement counter when the current value of the output transition counter is equal to the value of the input transition counter stored in the storage devices.

8. A delay measurement apparatus as claimed in claim 1, wherein the measurement counter is arranged to count down from a preset value.

9. A delay measurement apparatus as claimed in claim 8, wherein the measurement counter is arranged to issue a zero detect signal when its count reaches zero.

10. A delay measurement apparatus as claimed in claim 1, wherein the digital signal source is a clock with added noise.

11. A delay measurement apparatus as claimed in claim 1, wherein the digital signal source is obtained from a send or receive signal of a low power radar.

12. A low power radar comprising one or more delay units and one or more delay measurement apparatuses as claimed in claim 1.

13. A method of measuring the delay of a delay unit comprising:
counting clock cycles of a clock in a clock counter;
passing a digital signal through the delay unit, said digital signal being uncorrelated with the clock;
detecting transitions that enter the delay unit;
based on said entry transition detection, adding a current clock counter value to a first accumulator;
detecting transitions that exit the delay unit;
based on said exit transition detection, adding a current clock counter value to a second accumulator;
counting the number of detected transitions that have passed through the delay unit;
calculating an average number of clock cycles that elapse while a transition of the digital signal passes through the delay unit based on a value in said first accumulator, a value in said second accumulator and the counted number of transitions that have passed through the delay unit.

14. A method as claimed in claim 13, wherein the measurement method is initiated while the delay unit is in use.

15. A method as claimed in claim 13, wherein the first accumulator adds the clock counter value to its current stored value, wherein the second accumulator adds the clock counter value to its current stored value and wherein the calculation device comprises a subtractor that subtracts the first accumulator value from the second accumulator value.

16. A method as claimed in claim 13, comprising counting the number of detected transitions that have passed through the delay unit with a measurement counter, wherein the measurement counter counts a number of transitions detected entering the delay unit.

17. A method as claimed in claim 13, further comprising:
counting the transitions entering the delay unit; and
counting the transitions exiting the delay unit.

18. A method as claimed in claim 17, comprising counting the number of detected transitions that have passed through the delay unit with a measurement counter that comprises a first measurement counter that counts a number of measurements taken from transitions entering the delay unit and a second measurement counter that counts a number of measurements taken from transitions exiting the delay unit.

19. A method as claimed in claim 18, further comprising:
comparing the number of measurements taken from transitions entering the delay unit with the number of measurements taken from transitions exiting the delay unit and using that comparison to control the operation of the second measurement counter and the second accumulator.

20. A method as claimed in claim 19, comprising:
storing the current value of the input transition count,
comparing the current value of the output transition count with the stored value; and
enabling the second measurement counter when said values are equal.

21. A method as claimed in claim 13, comprising counting the number of detected transitions that have passed through the delay unit with a measurement counter that counts down from a preset value.

22. A method as claimed in claim 21, wherein the or each measurement counter issues a zero detect signal when its count reaches zero.

23. A method as claimed in claim 13, wherein the digital signal is a clock signal with added noise.

24. A method as claimed in claim 13, wherein the digital signal is obtained from the send or receive signal of a low power radar.

* * * * *